United States Patent
Asadi et al.

(10) Patent No.: US 11,664,821 B1
(45) Date of Patent: May 30, 2023

(54) ERROR FLOOR PERFORMANCE OF A BIT FLIPPING DECODER THROUGH IDENTIFYING UNRELIABLE CHECK NODES

(71) Applicant: SK hynix Inc., Icheon-si (KR)

(72) Inventors: Meysam Asadi, Fremont, CA (US);
Hongwei Duan, San Jose, CA (US);
Aman Bhatia, Los Gatos, CA (US);
Fan Zhang, Fremont, CA (US)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 17/650,339

(22) Filed: Feb. 8, 2022

(51) Int. Cl.
*H03M 13/00* (2006.01)
*H03M 13/11* (2006.01)

(52) U.S. Cl.
CPC ............... *H03M 13/1108* (2013.01)

(58) Field of Classification Search
CPC ........... H03M 13/116; H03M 13/1177; H03M 13/1108
See application file for complete search history.

(56) References Cited

U.S. PATENT DOCUMENTS

| | | | |
|---|---|---|---|
| 8,369,448 B2 | 2/2013 | Zhang et al. | |
| 8,689,092 B2 | 4/2014 | Sun et al. | |
| 9,258,015 B2 | 2/2016 | Ish-Shalom et al. | |
| 9,755,655 B1 * | 9/2017 | Hudner | H03K 5/249 |
| 10,141,953 B2 * | 11/2018 | Tai | H03M 13/175 |
| 10,177,787 B1 * | 1/2019 | Danjean | H03M 13/618 |
| 10,374,639 B2 * | 8/2019 | Bazarsky | H03M 13/1108 |
| 10,389,388 B2 | 8/2019 | Tate et al. | |
| 10,411,735 B1 * | 9/2019 | Chilappagari | H03M 13/116 |
| 10,491,243 B2 | 11/2019 | Kumar et al. | |
| 10,491,244 B2 * | 11/2019 | Chang | H03M 13/658 |
| 10,523,236 B2 | 12/2019 | Kuo | |
| 10,530,392 B2 * | 1/2020 | Reynwar | H03M 13/1117 |
| 10,574,274 B2 * | 2/2020 | Chang | H03M 13/1111 |
| 10,700,706 B2 | 6/2020 | Zhang et al. | |
| 11,018,695 B1 | 5/2021 | Zhang et al. | |
| 11,043,969 B2 | 6/2021 | Asadi et al. | |

(Continued)

OTHER PUBLICATIONS

Borwankar S., et al. entitled "Low Density Parity Check Code (LDPC Codes) Overview," 2020, 3 pages.

(Continued)

*Primary Examiner* — Esaw T Abraham
(74) *Attorney, Agent, or Firm* — Weaver Austin Villeneuve & Sampson LLP

(57) ABSTRACT

Techniques related to improving the error floor performance of a bit flipping (BF) decoder are described. In some examples, error floor performance is improved through determining a set of unreliable check nodes (CNs) and using information about the set of unreliable CNs to compute the flipping energies of variable nodes (VNs). In this manner, the flipping energies can be computed more accurately, thereby lowering the error floor. The set of unreliable CNs can be built through applying various criteria, such as criteria relating to the path length to an unsatisfied CN, the degree of a VN in a path to an unsatisfied CN, and/or checksum value. Path length and VN degree can be applied as selection criteria to determine which CNs qualify as members of the set of unreliable CNs. Checksum value can be applied as a trigger condition for building and/or using the set of unreliable CNs.

20 Claims, 10 Drawing Sheets

(56) References Cited

U.S. PATENT DOCUMENTS

| | | |
|---|---|---|
| 11,108,407 B1 | 8/2021 | Lu et al. |
| 11,146,289 B2 | 10/2021 | Bhatia et al. |
| 2021/0119643 A1 | 4/2021 | Xiong et al. |
| 2021/0167796 A1 | 6/2021 | Xiong et al. |

OTHER PUBLICATIONS

Tao Y., et al., entitled "Efficient Post-Processors for Improving Error-Corecting Performance of LDPC Codes," IEEE Transactions on Circuits and Systems-I: Regular papers, Oct. 2019, vol. 66(10), pp. 4032-4042.

Chung, S-Y. et al., "Analysis of Sum-Product Decoding of Low-Density Parity-Check Codes Using a Gaussian Approximation," IEEE Transactions on Information Theory, vol. 47, No. 2, Feb. 2001, pp. 657-670.

Vukobratović, D. et al., "Generalized ACE Constrained Progressive Edge-Growth LDPC Code Design," IEEE Communications Letters, vol. 12, No. 1, Jan. 2008, pp. 32-34.

Xiao, H. et al., "Improved Progressive-Edge-Growth (PEG) Construction of Irregular LDPC Codes," IEEE Communications Letters, vol. 8, No. 12, Dec. 2004, pp. 715-717.

\* cited by examiner $$H = \begin{bmatrix} 1 & 0 & 1 & 0 & 0 & 1 \\ 1 & 1 & 0 & 0 & 1 & 0 \\ 1 & 0 & 0 & 1 & 0 & 0 \\ 0 & 1 & 0 & 1 & 0 & 1 \end{bmatrix}$$

Variable Nodes        Check Nodes

ERROR FLOOR PERFORMANCE OF A BIT FLIPPING DECODER THROUGH IDENTIFYING UNRELIABLE CHECK NODES

BACKGROUND

Error-correction codes (ECCs) are frequently used for various types of data storage devices such as NAND flash memories. ECCs are also frequently used during the process of data transmission. ECC refers to codes that add redundant data, or parity data, to a message, such that the message can be recovered by a receiver equipped with a decoder even when one or more errors were introduced, either during the process of transmission, or storage. In general, an ECC decoder can correct a limited number of errors, with the number depending on the type of code used and/or the error correction capability of the decoder itself.

Low-density parity-check (LDPC) codes are an example of an ECC. In ECC decoding, including LDPC decoding, there is often a tradeoff between error correction capability and computation cost (e.g., power consumption or processing time). Generally, the higher the error correction capability, the more complex the decoding processing and the higher the power consumption and/or processing time. Bit flipping (BF) decoders and min-sum (MS) decoders are examples of ECC decoders that can perform decoding of LDPC codes. Compared to more complex decoders such as MS decoders, BF decoders are significantly faster but have lower error correction capability.

BRIEF SUMMARY

Techniques related to improving the error floor performance of a BF decoder are described. In particular, examples are described which relate to lowering the error floor region of a BF decoder through an improved BF decoding method that utilizes information about unreliable check nodes (CNs) during a flipping decision. The error floor is a region in the curve of code failure rate (CFR) versus failed bit count (FBC) where, beyond a certain number of errors (failed bits) in a received codeword sequence, the decoder cannot successfully decode a certain percentage of the codewords in the codeword sequence. The number of code failures in the error floor region is small compared to the number of correctly decoded codewords. However, depending on the performance requirements of the computing environment in which the data is being transmitted or stored, even a small number of code failures may be unacceptable.

In an example, a method for iterative decoding of an LDPC codeword involves identifying, during a first iteration, unsatisfied CNs among a set of CNs. The set of CNs represents a result of applying parity-check equations to the LDPC codeword. The method further involves determining a set of unreliable CNs such that a path length between each CN in the set of unreliable CNs and an unsatisfied CN is less than or equal to a maximum allowable path length. The method further involves computing a flipping energy for each variable node (VN) in a set of VNs based on a total number of unsatisfied CNs directly connected to the VN. The flipping energy of each VN in the set of VNs is further computed based on a total number of satisfied CNs that are directly connected to the VN and belong to the set of unreliable CNs. The method further involves updating bit-values of the set of VNs, where the updating comprises determining, for each VN in the set of VNs, whether to flip a bit-value of the VN based on a flipping energy of the VN. The method further involves updating, based on the updated bit-values of the set of VNs, bit-values of the set of CNs for use during a next iteration.

In the example method described above, the determining of the set of unreliable CNs can be conditioned upon a checksum computed using the bit-values of the set of CNs being less than or equal to a threshold value. Further, the threshold value can be set to a value associated with checksums expected in an error floor region.

In the example method described above, the determining of the set of unreliable CNs can involve excluding CNs that are connected to an unsatisfied CN through a high degree VN. A high degree VN can be any VN that is directly connected to more than a threshold number of CNs. In some implementations, the threshold number of CNs is less than or equal to five.

In the example method described above, the LDPC codeword can be a quasi-cyclic LDPC codeword.

In the example method described above, the set of VNs can correspond to a parity-check matrix that is divided into circulant submatrices, in which case the method may further involve restricting use of the set of unreliable CNs in computing flipping energy to a subset of VNs in each circulant submatrix. The subset of VNs can be selected through performing the following: during the first iteration, selecting the subset of VNs starting from a first direction; and during the next iteration, selecting the subset of VNs starting from a second direction that is opposite the first direction. The subset of VNs can be selected to include consecutive VNs or nonconsecutive VNs.

In an example, a device includes a memory storing an LDPC codeword. The device further includes one or more processing units configured to identify, during a first iteration, unsatisfied CNs among a set of CNs. The set of CNs represents a result of applying parity-check equations to the LDPC codeword. The one or more processing units are further configured to determine a set of unreliable CNs such that a path length between each CN in the set of unreliable CNs and an unsatisfied CN is less than or equal to a maximum allowable path length. The one or more processing units are further configured to compute a flipping energy for each variable node (VN) in a set of VNs based on a total number of unsatisfied CNs directly connected to the VN, and further based on a total number of satisfied CNs that are directly connected to the VN and belong to the set of unreliable CNs. The one or more processing units are further configured to update bit-values of the set of VNs through determining, for each VN in the set of VNs, whether to flip a bit-value of the VN based on a flipping energy of the VN. The one or more processing units are further configured to update, based on the updated bit-values of the set of VNs, bit-values of the set of CNs for use during a next iteration.

In the example device described above, the device can be configured to determine the set of unreliable CNs only in response to determining that a checksum computed using the bit-values of the set of CNs is less than or equal to a threshold value. In some implementations, the threshold value is set to a value associated with checksums expected in an error floor region.

In the example device described above, the device can be configured to exclude from the set of unreliable CNs any CNs that are connected to an unsatisfied CN through a high degree VN. A high degree VN can be any VN that is directly connected to more than a threshold number of CNs. In some implementations, the threshold number of CNs is less than or equal to five.

In the example device described above, the set of VNs can correspond to a parity-check matrix that is divided into circulant submatrices, in which case the one or more processing units can be further configured to restrict use of the set of unreliable CNs in computing flipping energy to a subset of VNs in each circulant submatrix. To select the subset of VNs, the one or more processors may perform the following: during the first iteration, selecting the subset of VNs starting from a first direction; and during the next iteration, selecting the subset of VNs starting from a second direction that is opposite the first direction. The subset of VNs can be selected to include consecutive VNs or non-consecutive VNs.

In an example, an error correction system includes multiple LDPC decoders, including at least a first LDPC decoder and a second LDPC decoder. The second LDPC decoder is a BF decoder configured to decode an LDPC codeword in less time than the first LDPC decoder. The BF decoder is configured to identify, during a first iteration, unsatisfied CNs among a set of CNs. The set of CNs represents a result of applying parity-check equations to the LDPC codeword. The BF decoder is further configured to determine a set of unreliable CNs such that a path length between each CN in the set of unreliable CNs and an unsatisfied CN is less than or equal to a maximum allowable path length. The BF decoder is further configured to compute a flipping energy for each VN in a set of VNs based on a total number of unsatisfied CNs directly connected to the VN, and further based on a total number of satisfied CNs that are directly connected to the VN and belong to the set of unreliable CNs. The BF decoder is further configured to update bit-values of the set of VNs through determining, for each VN in the set of VNs, whether to flip a bit-value of the VN based on a flipping energy of the VN. The BF decoder is further configured to update, based on the updated bit-values of the set of VNs, bit-values of the set of CNs for use during a next iteration.

In the example error correction system described above, the BF decoder can be configured to determine the set of unreliable CNs only in response to determining that a checksum computed using the bit-values of the set of CNs is less than or equal to a threshold value. In some implementations, the threshold value is set to a value associated with checksums expected in an error floor region.

In the example error correction system described above, the BF decoder can be configured to exclude from the set of unreliable CNs any CNs that are connected to an unsatisfied CN through a high degree VN. A high degree VN is any VN that is directly connected to more than a threshold number of CNs. In some implementations, the threshold number of CNs is less than or equal to five.

These illustrative examples are mentioned not to limit or define the disclosure, but to provide examples to aid understanding thereof. Additional embodiments and examples are discussed in the Detailed Description, and further description is provided there.

BRIEF DESCRIPTION OF THE DRAWINGS

An understanding of the nature and advantages of various embodiments may be realized by reference to the following figures. In the appended figures, similar components or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

In the following description, for the purposes of explanation, specific details are set forth in order to provide a thorough understanding of certain inventive embodiments. However, it will be apparent that various embodiments may be practiced without these specific details. The figures and description are not intended to be restrictive.

Figure 1:
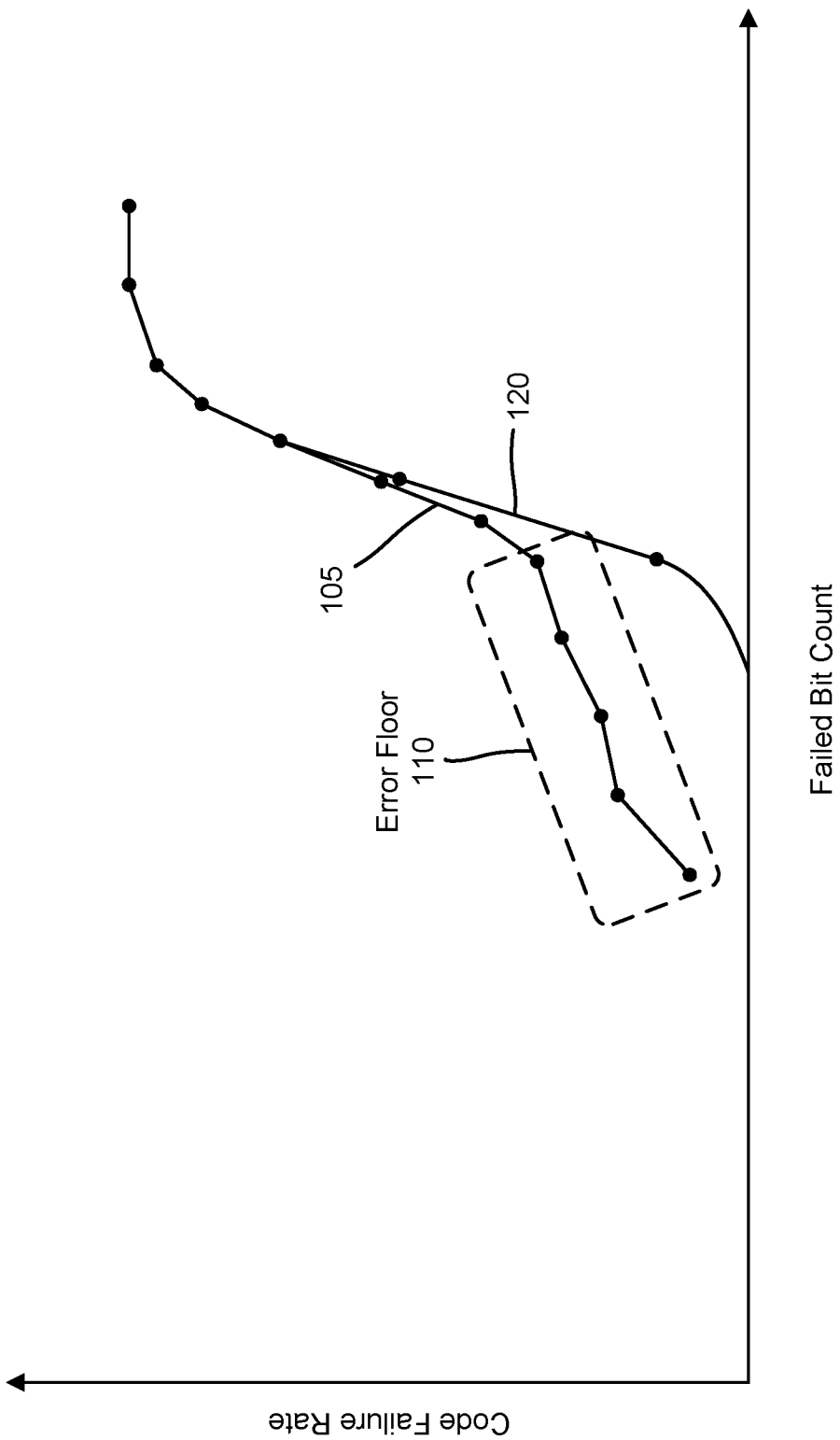
FIG. 1 illustrates an example graph of code failure rate versus failed bit count for a conventional BF decoder and a corresponding graph for a BF decoder implemented using example techniques described herein.

Techniques related to improving the error floor performance of a bit flipping (BF) decoder are described. In particular, examples are described which relate to lowering the error floor region of a BF decoder through an improved BF decoding method that utilizes information about unreliable check nodes during a flipping decision. FIG. 1 illustrates an example graph 105 of code failure rate (CFR) versus failed bit count (FBC) for a conventional BF decoder. FIG. 1 is provided merely to show the general shape of the graph 105, which is curved. As such, the units for each axis have been intentionally omitted. As shown in FIG. 1, the curve features an error floor 110 in which a relatively small number of code failures occur once a certain number of failed bits are encountered in a codeword sequence. For example, forty failed bits may correspond to a CFR of 0.1%. The error floor 110 has a relatively flat slope so that the code failure rate gradually increases with failed bit count. Once the failed bit count exceeds the maximum number of failed bits associated with the error floor, the code failure rate increases rapidly (e.g., fifty failed bits may correspond to a CFR of 1%) until at some point, 100% of the codes fail. The error floor 110 reflects the inability of the conventional BF decoder to successfully decode codewords once a threshold number of failed bits are encountered. Ideally, the curve should continue trending downward with a steep slope as the number of failed bits decreases. Accordingly, the example techniques described herein are directed toward lowering the error floor through increasing the error correction capability of a BF decoder.

FIG. 1 also shows a graph 120 of CFR vs FBC for a BF decoder implemented using the example techniques described herein. As shown in FIG. 1, the graph 120 is identical to the graph 105 at high failed bit counts. However, the graph 120 exhibits a lower error floor region (not labeled). For the same failed bit count in the error floor region 110 of the graph 105, the corresponding code failure rate in the graph 120 is significantly smaller.

Figure 2:
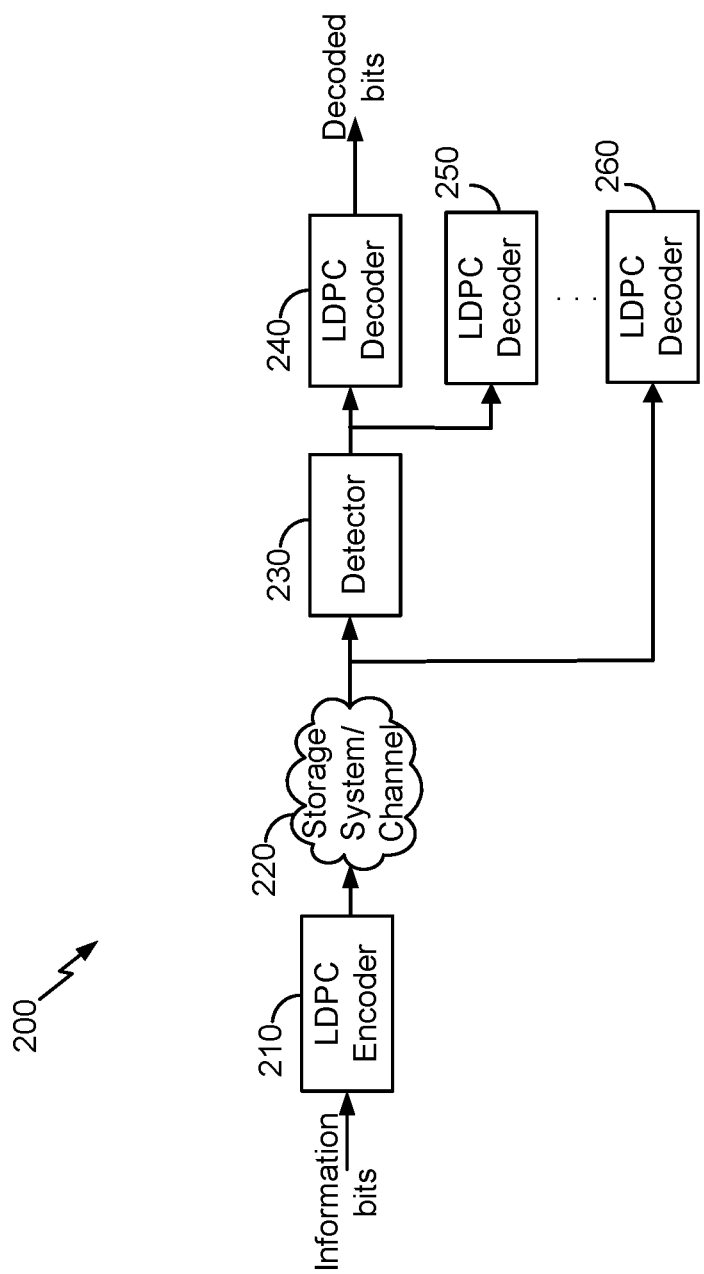
FIG. 2 illustrates an example high level block diagram of an error correction system, in accordance with certain embodiments of the present disclosure.

FIG. 2 illustrates an example high level block diagram of an error correction system 200, in accordance with certain embodiments of the present disclosure. In the example, low-density parity-check (LDPC) codes are described in connection with data storage. However, the embodiments of the present disclosure are not limited as such. Instead, the embodiments similarly apply to other usages of LDPC codes including, for example, data transmission. Further, the embodiments of the present disclosure can similarly apply to other error correction codes for which unreliable check nodes can be identified.

LDPC codes are linear block codes defined by a sparse parity-check matrix H, which consists of zeros and ones. The term "sparse matrix" is used herein to refer to a matrix in which a number of non-zero values in each column and each row is much less than its dimension. The term "column weight" is used herein to refer to the number of non-zero values in a specific column of the parity-check matrix H. The term "row weight" is used herein to refer to a number of non-zero values in a specific row of the parity-check matrix H. In general, if column weights of all the columns in a parity-check matrix corresponding to an LDPC code are similar, the code is referred to as a "regular" LDPC code. On the other hand, an LDPC code is called "irregular" if at least one of the column weights is different from other column weights. Usually, irregular LDPC codes provide better error correction capability than regular LDPC codes.

LDPC codes are also classified according to the way they are constructed. Random computer searches or algebraic constructions are possible. The random computer search construction describes an LDPC code having a parity-check matrix designed by a random computer-based procedure. Algebraic construction implies that the parity-check matrix has been constructed based on combinatorial methods. Quasi-cyclic LDPC (QC-LDPC) codes fall under the latter construction method. One advantage of QC-LDPC codes is that they have a relatively easier implementation in terms of the encoding procedure. The main feature of QC-LDPC codes is that the parity-check matrix consists of circulant submatrices, which could be either based on an identity matrix or a smaller random matrix. Permutation vectors could also be used in order to create the circulant submatrices.

As illustrated, an LDPC encoder 210 receives information bits that include data which is to be stored in a storage system 220. LDPC encoded data is output by the LDPC encoder 210 and is written to the storage system 220. In various embodiments, the storage system 220 may include a variety of storage types or media such as (e.g., magnetic) disk drive storage, flash storage, etc. In some embodiments, the techniques are employed in a transceiver and instead of being written to or read from storage, the data is transmitted and received over a wired and/or wireless channel. In this case, the errors in the received codeword may be introduced during transmission of the codeword.

When the stored data is requested or otherwise desired (e.g., by an application or user which stored the data), a detector 230 receives data from the storage system 220. The received data may include some noise or errors. The detector 230 performs detection on the received data and outputs decision and/or reliability information. For example, a soft output detector outputs reliability information and a decision for each detected bit. On the other hand, a hard output detector outputs a decision on each bit without providing corresponding reliability information. As an example, a hard output detector may output a decision that a particular bit is a "1" or a "0" without indicating how certain or sure the detector is in that decision. In contrast, a soft output detector outputs a decision and reliability information associated with the decision. In general, a reliability value indicates how certain the detector is in a given decision. In one example, a soft output detector outputs a log-likelihood ratio (LLR) where the sign indicates the decision (e.g., a positive value corresponds to a "1" decision and a negative value corresponds to a "0" decision) and the magnitude indicates how certain the detector is in that decision (e.g., a large magnitude indicates a high reliability or certainty).

The decision and/or reliability information is passed to an LDPC decoder 240 which performs LDPC decoding using the decision and reliability information. A soft input decoder utilizes both the decision and the reliability information to decode the codeword. A hard decoder utilizes only the decision values in the decoder to decode the codeword. The decoded bits generated by the LDPC decoder 240 are passed to the appropriate entity (e.g., the user or application which requested it). With proper encoding and decoding, the information bits match the decoded bits.

Although the output of the detector 230 may be beneficial for some LDPC decoders, not all error correction systems are configured with a detector. Further, the processing performed by detector 230 may be computation intensive, especially in regard to computing reliability information, which could significantly offset the advantages of using faster decoders such as BF decoders. Accordingly, in some implementations, LLR or other reliability information provided by a detector such as the detector 230 is not used as input to a BF decoder. Instead, the BF decoder may be configured to determine reliability for itself, e.g., through identifying unreliable check nodes using the techniques described below. However, the output of detector 230 may still be used for generating input to other decoders in the error correction system. The error correction system 200 may include multiple ECC or LDPC decoders that form a decoder hierarchy in which decoding is first attempted using a faster and/or less complex decoder (e.g., a BF decoder) before resorting to a slower and/or more complex decoder (e.g., an MS decoder). Accordingly, the error correction system 200 may include one or more additional LDPC decoders (e.g., an LDPC decoder 250 and an LDPC decoder 260), where at least some of the additional LDPC decoders do not receive output of the detector 230 (e.g., the LDPC decoder 260, as shown in FIG. 2). Further, in the case of a BF decoder implemented in accordance with one or more embodiments described herein, such a BF decoder may optionally be configured to use decision information from a detector such as the detector 230.

In various embodiments, an error correction system such as the system 200 in FIG. 2 may be implemented using a variety of techniques including an application-specific integrated circuit (ASIC), a field-programmable gate array (FPGA), and/or a general purpose processor (e.g., an Advanced RISC Machine (ARM) core).

LDPC codes are usually represented by bipartite graphs. One set of nodes, the variable nodes (VNs, also referred to as bit nodes) correspond to elements of the codeword and the other set of nodes, e.g., check nodes (CNs), correspond to the set of parity-check constraints satisfied by the codeword. Typically, the edge connections are chosen at random. The error correction capability of an LDPC code is improved if cycles of short length are avoided in the graph. In an (r,c) regular code, each of the n variable nodes (e.g., $V_0$, $V_1$, $V_2 \ldots V_{n-1}$) has connections to r check nodes, and each of the m check nodes (e.g., $C_0$, $C_1$, $C_2 \ldots C_{m-1}$) has connections to c variable nodes. Each check node represents a separate parity-check equation. Thus, r corresponds to the number of parity-check equations involving each code bit and also the degree of each variable node. Similarly, c corresponds to the number of code bits involved in each parity-check equation and also the degree of each check node. The number of variable nodes (n) corresponds to the total number of bits (data and parity) in the code, i.e., the codeword length.

In an irregular LDPC code, the check node degree is not uniform. Similarly, the variable node degree is not uniform. In QC-LDPC codes, the parity-check matrix H can be structured into blocks of p×p matrices such that a bit in a block participates in only one parity-check equation in the block, and each parity-check equation in the block involves only one bit from the block. In QC-LDPC codes, a cyclic shift of a codeword by p results in another codeword. Here p is the size of a square matrix which is either a zero matrix or a circulant matrix. This is a generalization of a cyclic code in which a cyclic shift of a codeword by 1 results in another codeword. The block of p×p matrix can be a zero matrix or cyclically shifted identity matrix of size p×p.

Figures 3A, 3B:
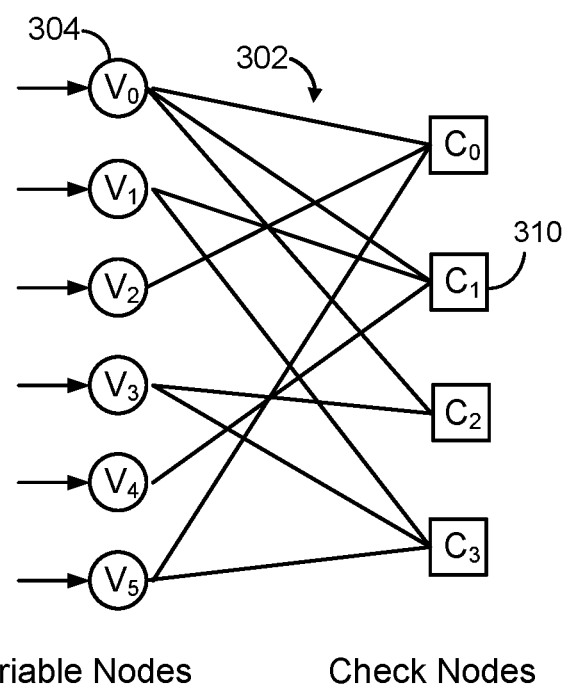
FIGS. 3A and 3B illustrate an example parity-check matrix and an example graph representing the parity-check matrix, in accordance with certain embodiments of the present disclosure.

FIG. 3A illustrates an example parity-check matrix H 300 and FIG. 3B illustrates an example bipartite graph corresponding to the parity-check matrix 300, in accordance with certain embodiments of the present disclosure. In this example, the parity-check matrix 300 has six column vectors and four row vectors. In practice, parity-check matrices tend to be much larger. Network 302 forms a bipartite graph representing the parity-check matrix 300. Various type of bipartite graphs are possible, including, for example, a Tanner graph.

Generally, the variable nodes in the network 302 correspond to the column vectors in the parity-check matrix 300. The check nodes in the network 302 correspond to the row vectors of the parity-check matrix 300. The interconnections between the nodes are determined by the values of the parity-check matrix 300. Specifically, a "1" indicates that the CN and VN at the corresponding row and column position have a connection. A "0" indicates there is no connection. For example, the "1" in the leftmost column vector and the second row vector from the top in the parity-check matrix 300 corresponds to the connection between a VN 304 and a CN 310 in FIG. 3B. Collectively, the check nodes represent a syndrome computed through applying the parity-check equations represented by the parity-check matrix 300 to the received codeword. A syndrome weight (also known as a checksum) can be computed by summing together the bit-values of all the check nodes.

A message passing algorithm is generally used to decode LDPC codes. Several variations of the message passing algorithm exist in the art, such as min-sum (MS) algorithm, sum-product algorithm (SPA) or the like. Message passing uses a network of variable nodes and check nodes, as shown in FIG. 3B. The connections between variable nodes and check nodes are described by and correspond to the values of the parity-check matrix 300, as shown in FIG. 3A. The content of a message passed from a variable node to a check node or vice versa depends on the message passing algorithm used.

A hard decision message passing algorithm may be performed in some instances. In a first step, each of the variable nodes sends a message to one or more check nodes that are connected to it. In this case, the message is a value that each of the variable nodes believes to be its correct value. The values of the variable nodes may be initialized according to the received codeword.

In the second step, each of the check nodes calculates a response to send to the variable nodes that are connected to it using the information that it previously received from the variable nodes. This step can be referred to as the check node update (CNU). The response message corresponds to a value that the check node believes that the variable node should have based on the information received from the other variable nodes connected to that check node. This response is calculated using the parity-check equations which force the values of all the variable nodes that are connected to a particular check node to sum up to zero (modulo 2).

At this point, if all the equations at all the check nodes are satisfied, meaning the value of each check node is zero, then the resulting checksum is also zero, so the decoding algorithm declares that a correct codeword is found and decoding terminates. If a correct codeword is not found (e.g., the value of any check node is one), the iterations continue with another update from the variable nodes using the messages that they received from the check nodes to decide if the bit at their position should be a zero or a one, e.g., using a majority voting rule in which the value of a variable node is set to the value of a majority of the check nodes connected to the variable node. The variable nodes then send this hard decision message to the check nodes that are connected to them. The iterations continue until a correct codeword is found, a certain number of iterations are performed depending on the syndrome of the codeword (e.g., of the decoded codeword), or a maximum number of iterations are performed without finding a correct codeword. It should be noted that a soft-decision decoder works similarly, however, each of the messages that are passed among check nodes and variable nodes can also include reliability information for each bit.

In an example, at least one iterative decoder in an error correction system (e.g., error correction system 200) is configured to perform a message passing algorithm as follows. However, the message passing algorithm may vary between decoders. For instance, the error correction system may include a second iterative decoder configured to perform a different message passing algorithm. In this example, $L(q_{ij})$ represents a message that is sent by variable node $v_i$ to check node $c_j$; $L(r_{ji})$ represents the message sent by check node $c_j$ to variable node $v_i$; and $L(c_i)$ represents the initial LLR value for each variable node $v_i$. Variable node processing for each $L(q_{ij})$ can be done through the following steps:

(1) Read $L(c_i)$ and $L(r_p)$ from memory.
(2) Calculate $L(Qi\text{-sum})=L(c_i)+\text{Scaling Factor}*\Sigma_{j'\in c_i}L(r_{ij'})$.
(3) Calculate each $L(Qi\text{-sum})-L(r_{ij})$.
(4) Output $L(Qi\text{-sum})$ and write back to memory.
(5) If this is not the last column of the memory, go to Step 1 and increment i by one.
(6) Compute parity-check-sums (e.g., syndrome), if they are all equal to zero, the number of iterations reaches a threshold and the parity-check-sums are greater than another threshold, or the number of iterations equals a maximum limit, stop; otherwise, perform check node processing.

Check node processing for each L(rji) can be performed as follows:
(1) Read one row of qij from memory.
(2) Calculate L(Rj-sum) as follows:

$$L(Rj - \text{sum}) = \left(\prod_{i' \in R_j} \alpha_{i'j}\right) \emptyset\left(\sum_{i' \in R_j} \emptyset(\beta_{i'j})\right)$$

$$\alpha_{ij} = \text{sign}(L(q_{ij})), \beta_{ij} = |L(q_{ij})|,$$

$$\emptyset(x) = -\log\left(\tanh\left(\frac{x}{2}\right)\right) = \log\left(\frac{e^x + 1}{e^x - 1}\right)$$

(3) Calculate the individual $L(r_{ji}) = (\prod_{i' \in R_{ji}} \alpha_{i'j}) \emptyset (\Sigma_{i' \in R_{ji}} \emptyset(\beta_{i'j}))$ for check nodes.
(4) Write back $L(r_{ji})$ to memory.
(5) If this is not the last row of memory, then go to the first step and increment j by one.

Figure 4:
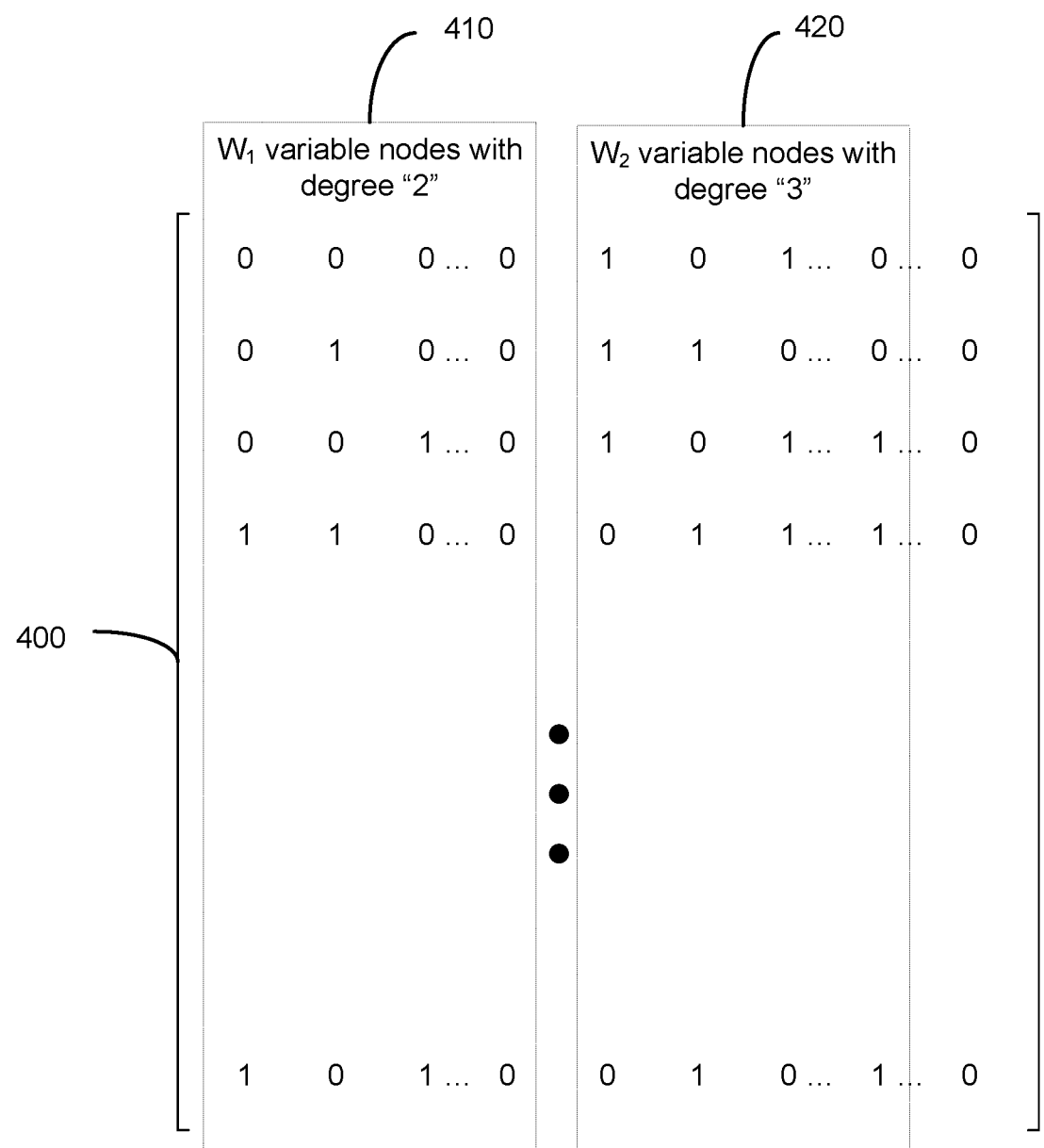
FIG. 4 illustrates an example representation of sets of variable nodes usable in circulant-based decoding of codewords, in accordance with certain embodiments of the present disclosure.

FIG. 4 illustrates an example representation of sets of variable nodes usable in circulant-based decoding of codewords (e.g., QC-LDPC codewords), in accordance with certain embodiments of the present disclosure. As described above, a parity-check matrix H can be used in the decoding of LDPC codewords. In the example of FIG. 4, a parity-check matrix H 400 includes circulant submatrices. A circulant submatrix corresponds to a matrix within the parity-check matrix H 400, where the different columns of this matrix have the same weight. In other words, each column of the parity-check matrix H 400 corresponds to a variable node. A "1" in a column corresponding to a variable node represents a connection of the variable node with a check node. The total number of "1"s in the column represents the total number of connections, and this total number is the weight of the column and is the degree of the variable node. The variable nodes represented in a circulant submatrix have the same number of "1"s and, hence, the same number of connections with check nodes (although the check nodes can be different) and the same degree.

In the example of FIG. 4, the parity-check matrix H 400 includes a first circulant submatrix 410 and a second circulant submatrix 420, among multiple circulant submatrices. The first circulant submatrix 410 includes a positive integer number "$W_1$" of columns representing "$W_1$" variable nodes. Each of these variable nodes has a degree of two, meaning the variable nodes are each directly connected to two check nodes. Similarly, the second circulant submatrix 420 includes a positive integer number "$W_2$" of columns representing "$W_2$" variable nodes. Each of the variable nodes in the circulant submatrix 420 has a degree of three.

Generally, the parity-check matrix H 400 includes sets of "$W_i$" variable nodes (represented by "$W_i$" columns). Each set has the same degree. The degrees can vary between the sets and some of the sets can have the same degree. In an example, the degree of a set of "$W_i$" variable nodes (e.g., of each variable in the set) can be a value between one and twenty. Degrees that are less than or equal to five are generally considered to be low degrees. Degrees that are greater than or equal to six are generally considered to be high degrees. The positive integer number "$W_i$" for each set of variable nodes represents the size of the set (e.g., the number of variable nodes, or equivalently, columns) and can be a value between, for example, one and two thousand forty eight. For instance "$W_1$" can be one-hundred twenty-eight and instance "$W_2$" can be two-hundred fifty-six.

Vertical decoding can be performed based on the parity-check matrix H 300. For example, the decoding can be performed by selecting and processing a set of $W_i$" variable nodes prior to the selecting and processing of a next set of "$W_i$" variable nodes. For instance, the variable nodes in the "$W_1$" set are processed first, then the variable nodes in the "$W_2$" set, and so on. In general, each decoding iteration involves processing all of the circulant submatrices in a parity-check matrix, but not necessarily all at once. For example, a single iteration may take place over the course of multiple clock cycles, with one or more circulant submatrices being processed in each clock cycle.

FIG. 4 is merely one example of how a parity-check matrix can be divided into circulant submatrices for processing. Although FIG. 4 depicts each circulant submatrix as spanning all the rows of the parity-check matrix, this is not necessarily always the case. For example, in some embodiments, a circulant submatrix may only correspond to a subset of rows within the parity-check matrix.

Figure 5:
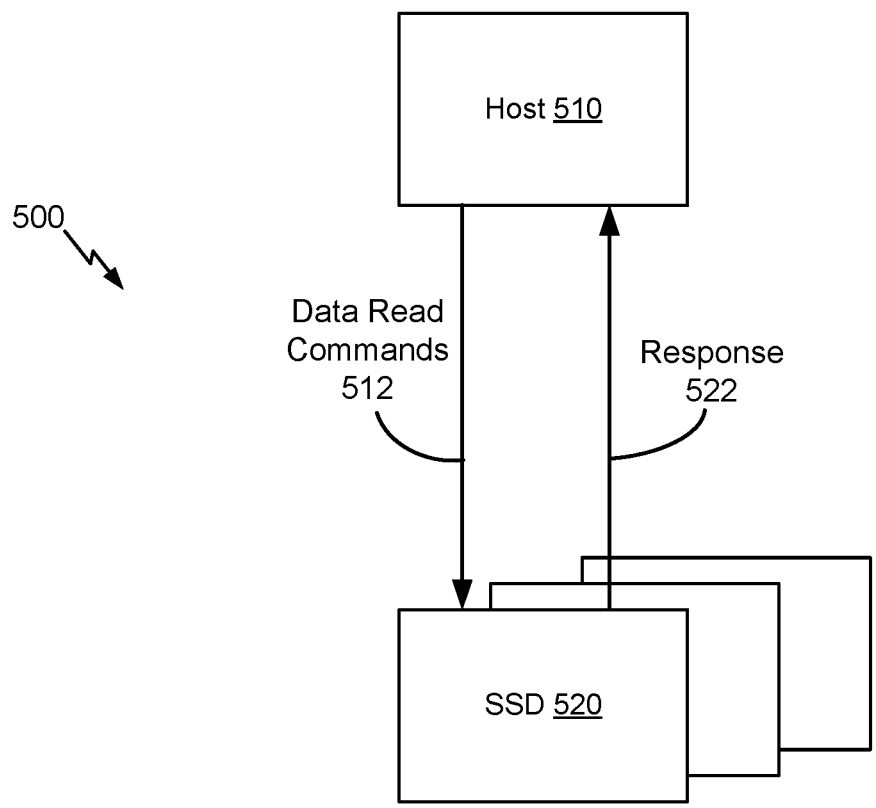
FIG. 5 illustrates an example architecture of a computer system, in accordance with certain embodiments of the present disclosure.

FIG. 5 illustrates an example architecture of a computer system 500, in accordance with certain embodiments of the present disclosure. In an example, the computer system 500 includes a host 510 and one or more solid state drives (SSDs) 520. The host 510 stores data on behalf of clients, e.g., the SSDs 520. The data is stored in an SSD as codewords for ECC protection. For instance, the SSD can include an error correction system comprising one or more ECC encoders (e.g., the LDPC encoder 210 of FIG. 2).

The host 510 can receive a request from a client for the client's data stored in the SSDs 500. In response, the host sends data read commands 512 to the SSDs 520 as applicable. Each of the SSDs 520 processes the received data read command and sends a response 522 to the host 510 upon completion of the processing. The response 522 can include the read data and/or a decoding failure. In an example, each of the SSDs includes at least one ECC decoder (e.g., one or more of the LDPC decoders in FIG. 2). Further, at least one of the SSDs 520 may include a BF decoder. In particular, some or all of the SSDs 520 may include a BF decoder that takes into account information about unreliable check nodes when deciding whether to flip the bit-value of a variable node, where the information about unreliable check nodes is determined through building a set of unreliable check nodes using the techniques described below.

Processing the data read command and sending the response 522 includes decoding by the ECC decoder(s) the codewords stored in the SSD to output the read data and/or the decoding failure. Some of the codewords may be decoded by a BF decoder, for example, a BF decoder that uses vertical decoding as described above in connection with FIG. 4 or some other decoding technique applied to circulant submatrices.

In an example where an SSD 520 includes a BF decoder and one or more additional ECC decoders, the SSD may be configured to attempt an initial decoding of its stored codewords using the BF decoder. The one or more additional ECC decoders can remain inactive while the BF decoder is decoding. If the decoding by the BF decoder is unsuccessful, the SSD may select one of the additional ECC decoders (e.g., based on a hierarchical order) for performing decoding. Thus, the one or more additional ECC decoders may act as backup decoders in the event that the BF decoder cannot fully decode a codeword. A backup decoder need not process all the codewords input to the BF decoder. Instead, in some examples, the input to a backup decoder is a subset of the input to a previously selected decoder, where the subset corresponds to codewords that the previously selected decoder failed to fully decode. Further, some of the additional ECC decoders may be operated in parallel with the BF decoder to perform parallel processing of codewords. For example, as discussed below in connection with FIG. 6, an incoming set of codewords can be distributed across a BF decoder and an MS decoder so that each decoder processes a distinct subset of codewords.

Generally, an SSD can be a storage device that stores data persistently or caches data temporarily in nonvolatile semiconductor memory and is intended for use in storage systems, servers (e.g., within datacenters), and direct-attached storage (DAS) devices. A growing number of applications need high data throughput and low transaction latency, and SSDs are used as a viable storage solution to increase performance, efficiency, and reliability. SSDs generally use NAND flash memory and deliver higher performance and consume less power than spinning hard-disk drives (HDDs). NAND Flash memory has a number of inherent issues associated with it, the two most important include a finite life expectancy as NAND Flash cells wear out during repeated writes, and a naturally occurring error rate. SSDs can be designed and manufactured according to a set of industry standards that define particular performance specifications, including latency specifications, to support heavier write workloads, more extreme environmental conditions and recovery from a higher bit error rate (BER) than a client SSD (e.g., personal computers, laptops, and tablet computers).

Figure 6:
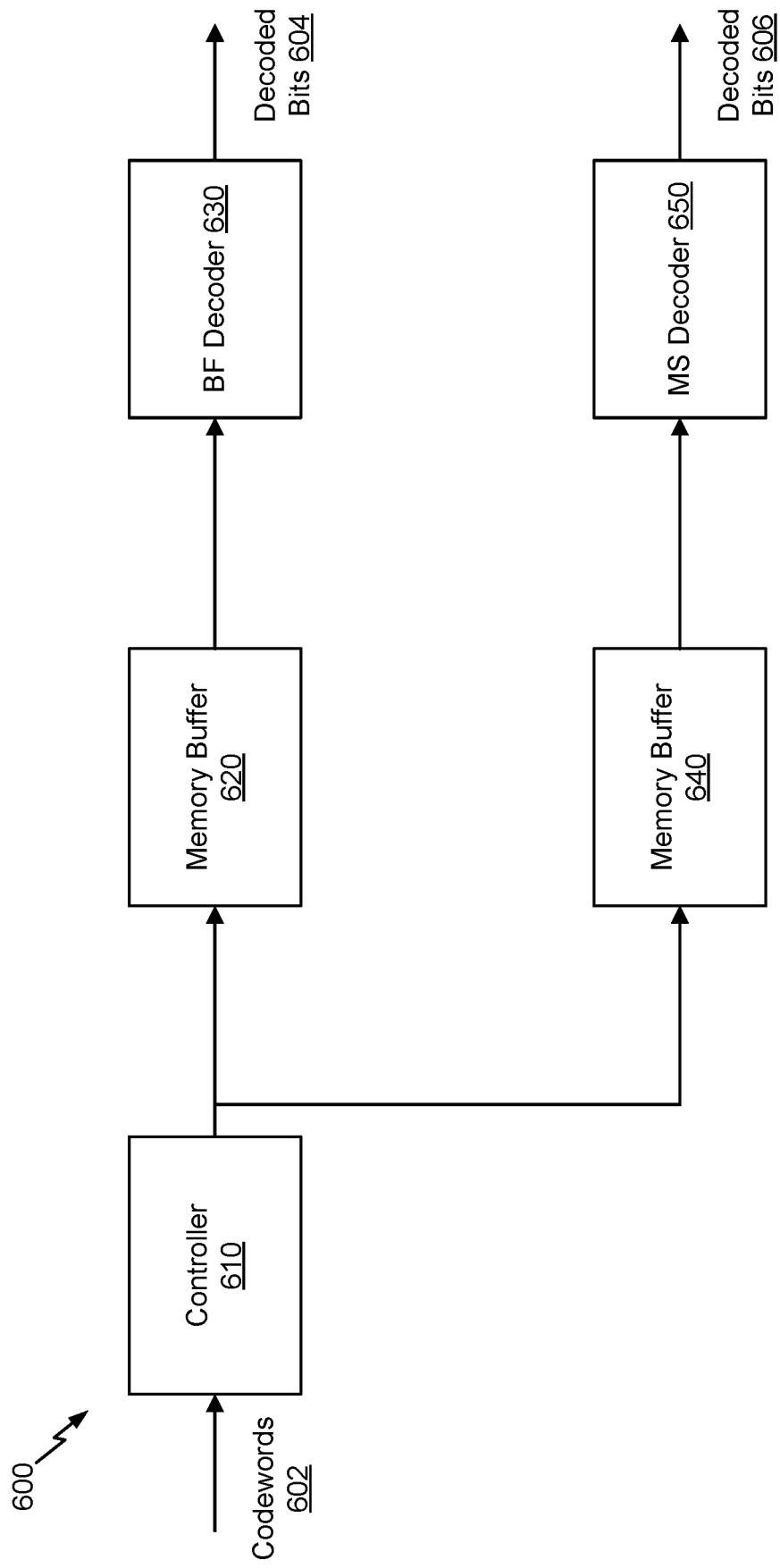
FIG. 6 illustrates an example error correction system that includes multiple ECC decoders, in accordance with certain embodiments of the present disclosure.

FIG. 6 illustrates an example error correction system 600 that includes multiple ECC decoders, in accordance with certain embodiments of the present disclosure. The error correction system 600 can be included in a memory device, such as an SSD 520 of FIG. 5. In turn, the error correction system 600 includes a controller 610, a memory buffer 620 corresponding to a BF decoder 630, and a memory buffer 640 corresponding to a min-sum (MS) decoder 650. The controller 610 can determine which of the two decoders 630 and 650 are to be used to decode different codewords 602 based on an estimate of the number of raw bit-errors for each of the codewords. The bit-errors can be due to noise and, accordingly, the codewords 602 can include noisy codewords. The BF decoder 630 outputs decoded bits 604 corresponding to one or more of the codewords 602, where the decoded bits 604 remove some or all of the noise (e.g., correct the error bits). Similarly, the MS decoder 650 outputs decoded bits 606 corresponding to remaining one or more of the codewords 602, where the decoded bits 606 remove some or all of the noise (e.g., correct the error bits).

If the controller 610 determines that a codeword has a severe bit error rate, a decoding failure is likely with the two decoders 630 and 650. In such instances, and assuming that the only decoders in the error correction system 600 are the decoders 630 and 650, the controller 610 may skip decoding altogether to, instead, output an error message. Otherwise, the codeword can be dispatched to the BF decoder 630 when the controller 610 determines that the bit-error rate falls within the error correction capability of the BF decoder 630. Alternatively, the codeword can be dispatched to the MS decoder 650 when the controller 610 determines that the bit-error rate is outside the error correction capability of the BF decoder 630 but within the error correction capability of the MS decoder 650. Dispatching the codeword includes storing the codeword into one of the memory buffers 620 or 640 depending on the controller's 510 determination. The memory buffers 620 and 640 are used because, in certain situations, the decoding latency is slower than the data read rate of a host reading the codewords 602.

Accordingly, over time, the codewords 602 are stored in different input queues for the BF decoder 630 and the MS decoder 650. For typical SSD usage, it is expected that most traffic would go to the BF decoder 630. Hence, it is important that the BF decoder's performance is improved. Although FIG. 6 illustrates only one low latency and high throughput decoder (BF decoder 630) and one high error correction capability decoder (MS decoder 650), a different number of decoders can be used. For instance, a second BF decoder can be also used and can have the same or a different configuration than the BF decoder 630.

In an example, the BF decoder 630 may process a fixed number "$W_i$" of variable nodes in one clock-cycle. In other words, for each of the "$W_i$" variable nodes to be processed in this cycle, the BF decoder 630 counts the number of neighboring check-nodes that are unsatisfied. As used herein, the term "neighboring" means directly connected via single graph edge. Accordingly, neighboring check nodes for a given variable node are those check nodes which are directly connected to the variable node. However, in some implementations, a neighboring check node can be a check node that is farther away (e.g., connected through a path length of two).

The count of neighboring, unsatisfied check nodes is used to the compute a numerical value of a flipping energy for the variable node. As described below, the flipping energy for at least some variable nodes can be computed taking into further account the total number of neighboring satisfied but unreliable check nodes. Once the flipping energy for a variable node has been computed, the BF decoder 630 compares this number to a flipping threshold. If the flipping energy is larger than the flipping threshold, the BF decoder 630 flips the current bit-value of the variable node.

The processing of all the variable nodes of the LDPC codes for a single iteration may occur over multiple clock cycles. In an example featuring circulant submatrices, each clock cycle may involve computing flipping energies for variable nodes associated with one or more circulant submatrices and updating the bit-values of those variable nodes accordingly. In general, all circulant submatrices are processed over the course of a single iteration. At the end of the iteration, the BF decoder 630 updates the bit-values of the check nodes using the updated bit-values of the variable nodes, and the BF decoder 630 may proceed to the next iteration if any of the check nodes remain unsatisfied or a maximum allowable number of iterations has not yet been reached.

In order to improve the error correction capability of a BF decoder such as the BF decoder 630, the flipping energy of at least some variable nodes can be computed taking into account the total number of neighboring satisfied but unreliable check nodes. This would make the flipping energy more indicative of the likelihood that the bit-value of a variable node is in error. Aspects of the present disclosure relate to identifying unreliable check nodes and, more specifically, unreliable check nodes that are associated with the error floor region of a BF decoder. The error floor region is challenging with respect to making bit flipping decisions because the flipping energy can be very close to (e.g., slightly below or slightly above) the flipping threshold if the flipping energy is computed solely based on the total number of neighboring, unsatisfied check nodes. In some scenarios, this could result in an infinite loop where, but for the limitation to a maximum allowable number of iterations, certain variable nodes and their connected check nodes would keep flipping back and forth between the same values indefinitely.

The error floor region of a decoder is attributed to trapping sets. Each trapping set represents an error pattern and is a specific combination of variable nodes that, if the bit-values of all the variable nodes in the trapping set are in error, then the decoder will be unable to correct those errors. A decoder with a higher error correction capability will have fewer trapping sets and/or larger-sized trapping sets compared to a decoder with a lower error correction capability. For example, conventional BF decoders have a greater number of trapping sets compared to MS decoders, resulting in code failures at lower failed-bit counts. As discussed above, one of the advantages of a BF decoder is its decoding speed. Using a decoder with higher error correction capability may not always be feasible due to additional decoding latency. BF decoders that use more complex message passing techniques (e.g., 2-bit wide messages, where one bit is used to signal node reliability) are another option but tend to be costly due to increased implementation complexity (e.g., higher logic-gate count) and increased power consumption.

A trapping set can be "broken down" if the correct bit-value for at least some of the variable nodes in the trapping set can be determined. Once the correct bit-value for a small number of variable nodes (as few as one node) in the trapping set are identified, the decoder will be able to determine the correct bit-values for the remaining variable nodes. For an iterative decoder, it may take multiple iterations to break down a trapping set and generate the decoded bits of a codeword, but the bit-values will eventually converge to their correct values without incurring any significant amount of additional delay beyond the typical processing times of the iterative decoder.

To lower the error floor, a decoder configured according to one or more embodiments described herein can identify a set of unreliable check nodes in order to take those unreliable check nodes into account when computing the flipping energies of variable nodes. Unreliable check nodes are check nodes that, because they are connected to an unsatisfied check node, may be unreliable even though they themselves might be satisfied. An unreliable check node can lead to incorrect calculation of a connected variable node's flipping energy and, as described below in reference to FIG. 7, can be identified based on path length.

Figure 7:
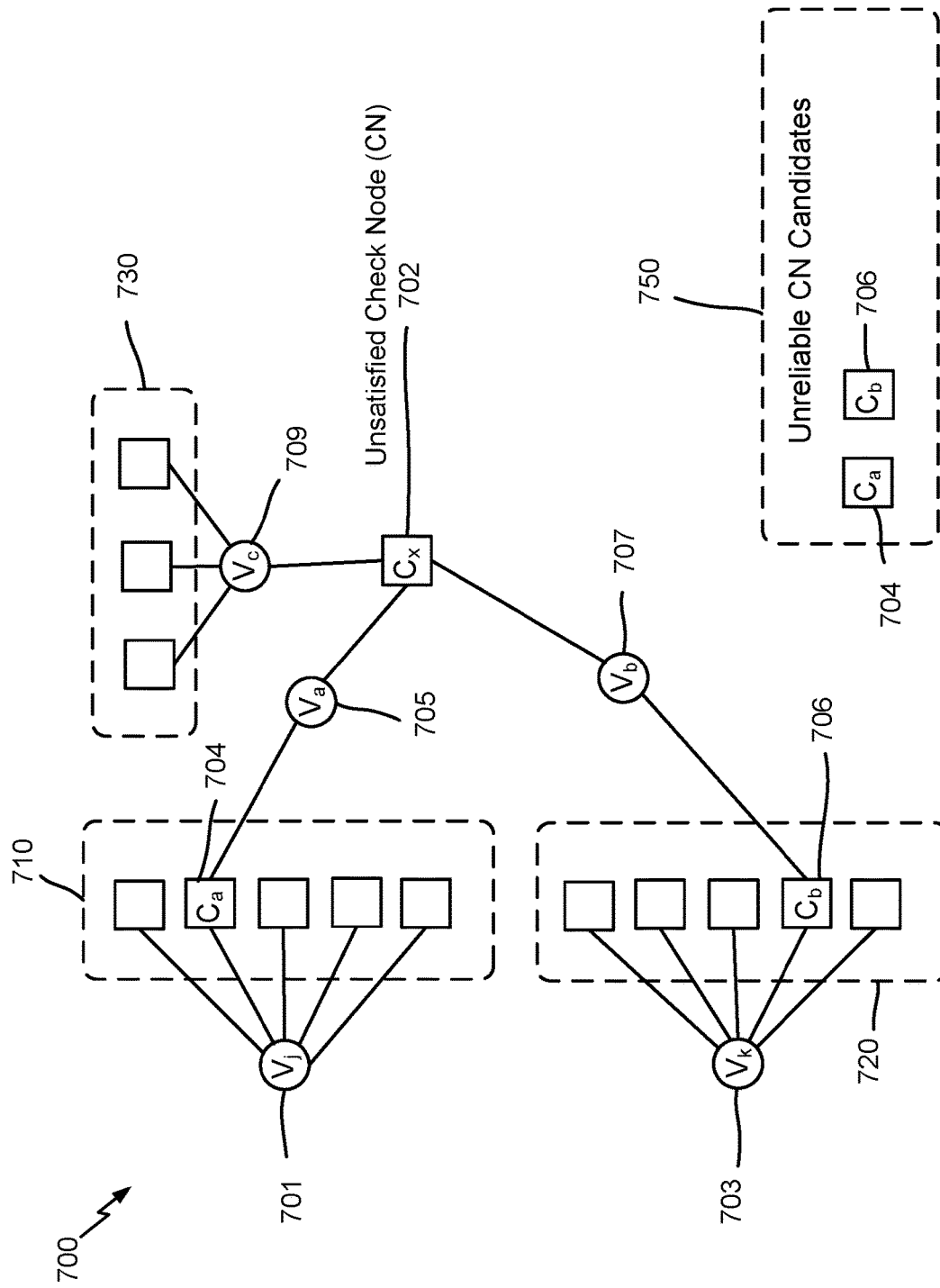
FIG. 7 illustrates an example process for identifying unreliable check nodes, in accordance with certain embodiments of the present disclosure.

FIG. 7 illustrates an example process for identifying unreliable check nodes, in accordance with certain embodiments of the present disclosure. The process of FIG. 7 is described in reference to a graph 700 corresponding to a parity-check matrix. Unlike the graph shown in FIG. 3B, the graph 700 is unfolded to better illustrate the interactions between the variable nodes and the check nodes and how a value of a check node may affect a value of a variable node or vice versa even though the check node and the variable node may not be directly connected. Further, it will be understood that the graph 700 may only represent a portion of a parity-check matrix, i.e., that the graph 700 may be a partial graph. In practice, the graph of a parity-check matrix would typically be much larger, and the paths connecting the various nodes may be more complex than shown in FIG. 7.

The graph 700 includes an unsatisfied check node $C_x$ 702. The bit-values of the variable nodes and the check nodes in the graph 700 may be initialized based on a received codeword, for example, by setting the bit-values of the variable nodes to the values of corresponding bits in the codeword and performing check node processing to update the bit-values of the check nodes based on the initial bit-values of the variable nodes and in accordance with parity-check equations. As shown in FIG. 7, the unsatisfied check node 702 is connected to a check node $C_a$ 704 through a variable node $V_a$ 705 and to a check node $C_b$ 706 through a variable node $V_b$ 707. In turn, the check nodes 704 and 706 are connected to variable nodes $V_j$ 701 and $V_k$ 703, respectively.

Because the variable node 701 is connected, albeit indirectly, to the unsatisfied check node 702, the bit-value of the variable node 701 may be erroneous and may need to be flipped. Similarly, because the variable node 703 is connected to the unsatisfied check node 702, the bit-value of the variable node 703 may also need to be flipped. FIG. 7 shows the variable node 701 being directly connected to a set 710 of five check nodes including the check node 704. In the error floor region, it is often the case that there is no clear majority of neighboring check nodes. For example, three out of the five check nodes in the set 710 could be satisfied while the remaining two check nodes are unsatisfied. Accordingly, if the decision whether to flip the variable node 701 were based on a majority voting procedure in which only the states of neighboring check nodes were taken into consideration, the flipping decision may not necessarily set the bit-value of the variable node 701 to the correct value. Further, if the flipping decision were based on a flipping energy of the variable node 701 as computed by simply summing the number of unsatisfied check nodes in the set 710, the flipping energy could be very close to a flipping threshold. A similar problem may arise with the variable node 703, which is directly connected to a set 720 of five check nodes including the check node 706. To compute a more accurate flipping energy, the presence of unreliable check nodes can also be taken into consideration, as explained in further detail below.

In some examples, a set of unreliable check nodes is built based on identifying unsatisfied check nodes. The set of unreliable check nodes can be a global set applicable to all variable nodes in a parity-check matrix. In an iterative decoder, the set of unreliable check nodes can be rebuilt with each iteration. In FIG. 7, the set of unreliable check nodes (750) includes the check nodes 704 and 706. To build the set of unreliable check nodes 750, candidate unreliable check nodes are first identified based on path length. Specifically, a candidate unreliable check node can be identified as being any check node connected to an unsatisfied check node (e.g., the unsatisfied check node 702) through a path length that is less than or equal to a maximum allowable path length $\ell$. As the path length between an unsatisfied check node and a satisfied check node increases, the reliability of the satisfied check node increases. In other words, the reliability of a satisfied check node is proportional to the length of the path to the closest unsatisfied check node. Accordingly, a BF decoder can be configured with a maximum allowable path length $\ell$ that is relatively short (e.g., $\ell = 2$ or 3), so that check nodes connected through longer path lengths are disqualified from being considered for membership in the set of unreliable check nodes. As shown in FIG. 7, the paths connecting the unsatisfied check node 702 to the check nodes 704 and 706 are of length 2 (traversing two edges). Accordingly, the check nodes 704 and 706 would be identified as candidates if $\ell = 2$ or 3.

In addition to path length, another criterion for identifying candidate unreliable check nodes may be the degree of a variable node along a path leading to an unsatisfied check node. The degree of a variable node is the number of check nodes that are directly connected to the variable node. In the error floor region, the variable nodes that are in error tend to be of low degree. Accordingly, a BF decoder can be configured with a maximum allowable degree $\deg_v$ that is relatively low so that check nodes which are connected to an unsatisfied check node through a high degree variable node are excluded from the set of unreliable check nodes. As discussed above, degrees that are less than or equal to five are generally considered to be low degrees, whereas degrees that are greater than or equal to six are generally considered to be high degrees. However, the maximum allowable degree may vary depending on the implementation of the decoder. In the example of FIG. 7, $deg_v=3$ so that each check node in a set 730 of check nodes is excluded from membership in the set of unreliable check nodes 750 based on being connected to the unsatisfied check node 702 through a variable node $V_c$ 709 of degree 4.

In building the set of unreliable check nodes 750, the satisfied/unsatisfied status of a check node can be disregarded. Thus, the check nodes included in the set of unreliable check nodes 750 could include satisfied check nodes, unsatisfied check nodes, or both. However, as discussed below, only satisfied check nodes within a set of unreliable check nodes may be considered when updating the flipping energy of a variable node. That is because unsatisfied check nodes may already be accounted for during an initial computation of flipping energy. For example, the flipping energy of a variable node could be computed as the sum of a first term and a second term. The first term corresponds to the total number of neighboring (e.g., directly connected) unsatisfied check nodes. The second term corresponds to the total number of neighboring satisfied check nodes that are also members of a set of unreliable check nodes. Accordingly, in some implementations, the set of unreliable check nodes may be built to include only satisfied check nodes.

As mentioned above, the set of unreliable check nodes can be a global set applicable to all variable nodes in a parity-check matrix. For instance, the set of unreliable check nodes 750 can be rebuilt anew in each iteration after identifying all unsatisfied check nodes for the current iteration. The set of unreliable check nodes 750 can then be referenced when the flipping energy of any variable node is to be updated during the current iteration. A global set of unreliable check nodes provides for an efficient way of factoring in the presence of unreliable check nodes when computing flipping energy without necessarily relying on more complex flipping energy computation techniques and/or more complex forms of reliability information. For instance, due to complexity of implementation, it may not be feasible to perform a graph search for each variable node individually in order to identify unreliable check nodes for a particular variable node before computing the flipping energy of that particular variable node.

Figure 8:
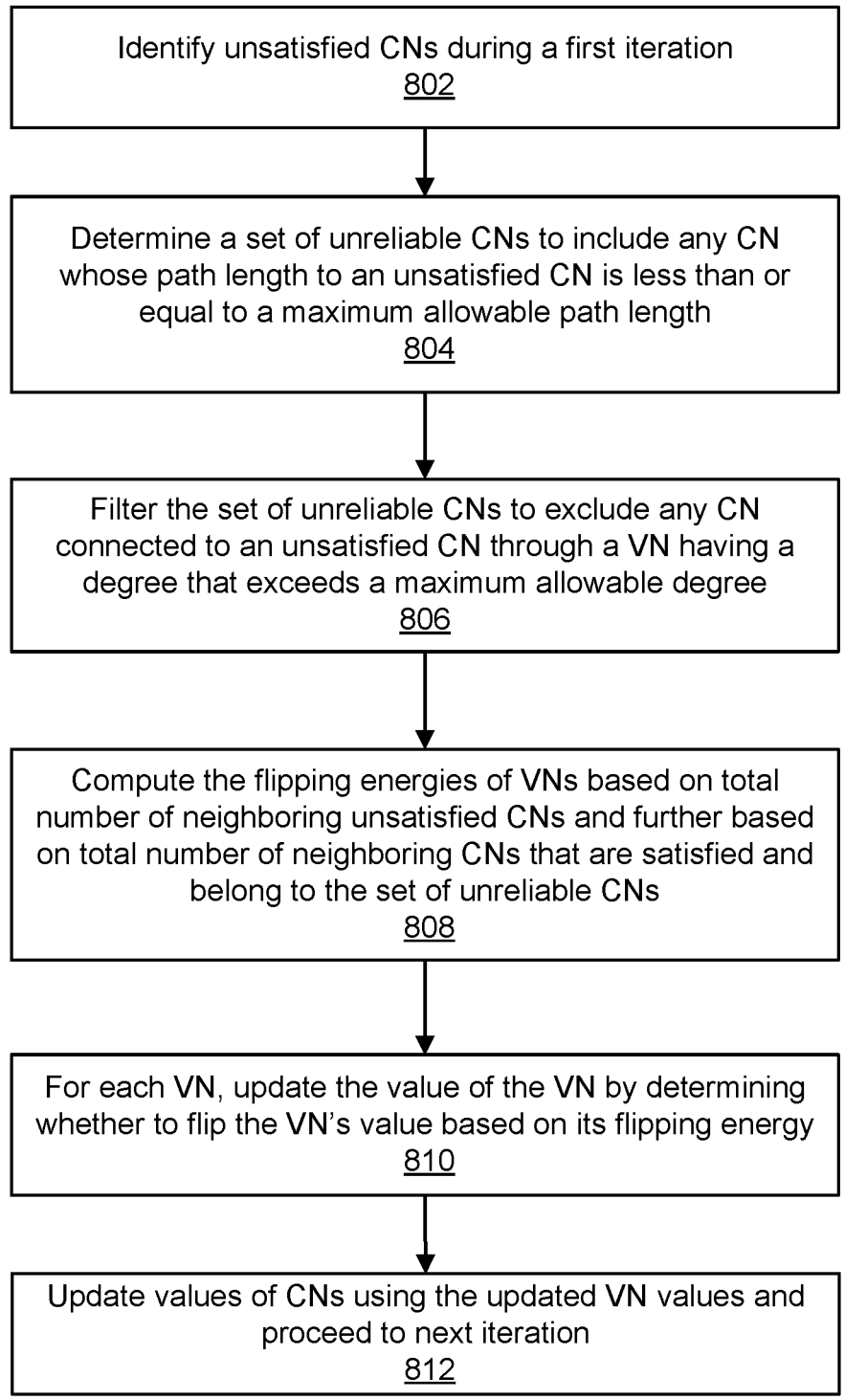
FIG. 8 is a flow diagram of an example process for decoding a codeword, in accordance with certain embodiments of the present disclosure.

FIG. 8 is a flow diagram of an example process 800 for decoding a codeword, in accordance with certain embodiments of the present disclosure. The process 800 can be performed by a BF decoder that receives ECCs (e.g., LDPC codes) for decoding. At operation 802, unsatisfied check nodes are identified during a first iteration. The first iteration can be an iteration during which an initial syndrome is computed by applying parity-check equations to the bit-values of a received codeword. However, the functionality described with respect to the first iteration in the process 800 is also applicable to other iterations. As discussed above, each check node represents a corresponding bit of a syndrome. The checksum (also known as syndrome weight) for any particular syndrome can be computed by summing the bit-values of all the bits in the syndrome. In iterative decoding, the bit-values of variable nodes are updated to compute a new syndrome for each subsequent iteration. A check node is unsatisfied when the bit-value of the check node is one. A syndrome consisting entirely of zeros is associated with an error-free codeword.

At operation 804, a set of unreliable check nodes are determined to include any check node whose path length to an unsatisfied check node (any of the unsatisfied check nodes identified in operation 802) is less than or equal to a maximum allowable path length. The functionality in operation 804 may correspond to an identification of an initial set of candidates for membership in the set of unreliable check nodes, using path length as a selection criterion.

At operation 806, the set of unreliable check nodes determined in operation 804 is filtered to exclude any check node connected to an unsatisfied check node through a variable node having a degree that exceeds a maximum allowable degree. The maximum allowable degree may vary depending on implementation but is generally set to exclude check nodes that are connected through high degree variable nodes.

At operation 808, the flipping energies of variable nodes is computed based on the total number of neighboring unsatisfied check nodes. The flipping energies are also computed based on the total number of neighboring check nodes that are satisfied and belong to the set of unreliable check nodes. For instance, the flipping energy for a variable node can be calculated as the sum of these two totals. In the example, of FIG. 7, the flipping energy of the variable node 701 would be incremented by one assuming that the check node 704 is satisfied. Similarly, the flipping energy of the variable node 703 would be incremented by one assuming that the check node 706 is satisfied.

Further, as discussed below in reference to FIG. 9, using a set of unreliable check nodes to compute flipping energy can be restricted to a subset of variable nodes. Accordingly, not every variable node in a parity-check matrix needs to have its flipping energy computed as a function of the number of neighboring check nodes that are satisfied and belong to the set of unreliable check nodes.

At operation 810, a separate flipping decision is made with respect to each variable node in the parity-check matrix. For each variable node, the bit-value of the variable node is updated by determining, based on the variable node's flipping energy, whether to flip the bit-value or keep the bit-value unchanged. The flipping decision may involve comparing the flipping energy to a flipping threshold and flipping the bit-value in response to determining that the flipping energy exceeds the flipping threshold.

At operation 812, the values of the check nodes in the parity-check matrix are updated in preparation for the next iteration, using the bit-values of the variable nodes as updated in operation 810. The process 800 then proceeds to the next iteration, where operations 802 to 812 may be repeated to determine a new set of unreliable check nodes used in computing flipping energies in the next iteration. This may continue until some maximum allowable number of iterations is reached or the checksum for the syndrome of the current iteration is zero.

FIG. 8 is provided to illustrate, at a high level, operations that a BF decoder can perform as part of decoding a codeword using reliability information derived as a result of identifying unreliable check nodes. FIG. 8 is merely an example of a decoding process that takes unreliable check nodes into consideration. A more detailed example of a BF decoding procedure involving a parity-check matrix with circulant submatrices is shown in FIG. 9. It will be understood that aspects of the procedures outlined in FIGS. 8 and 9 may be combined, for example, such that the process 800 involves additional operations, fewer operations, or a different order of operations.

Figure 9:
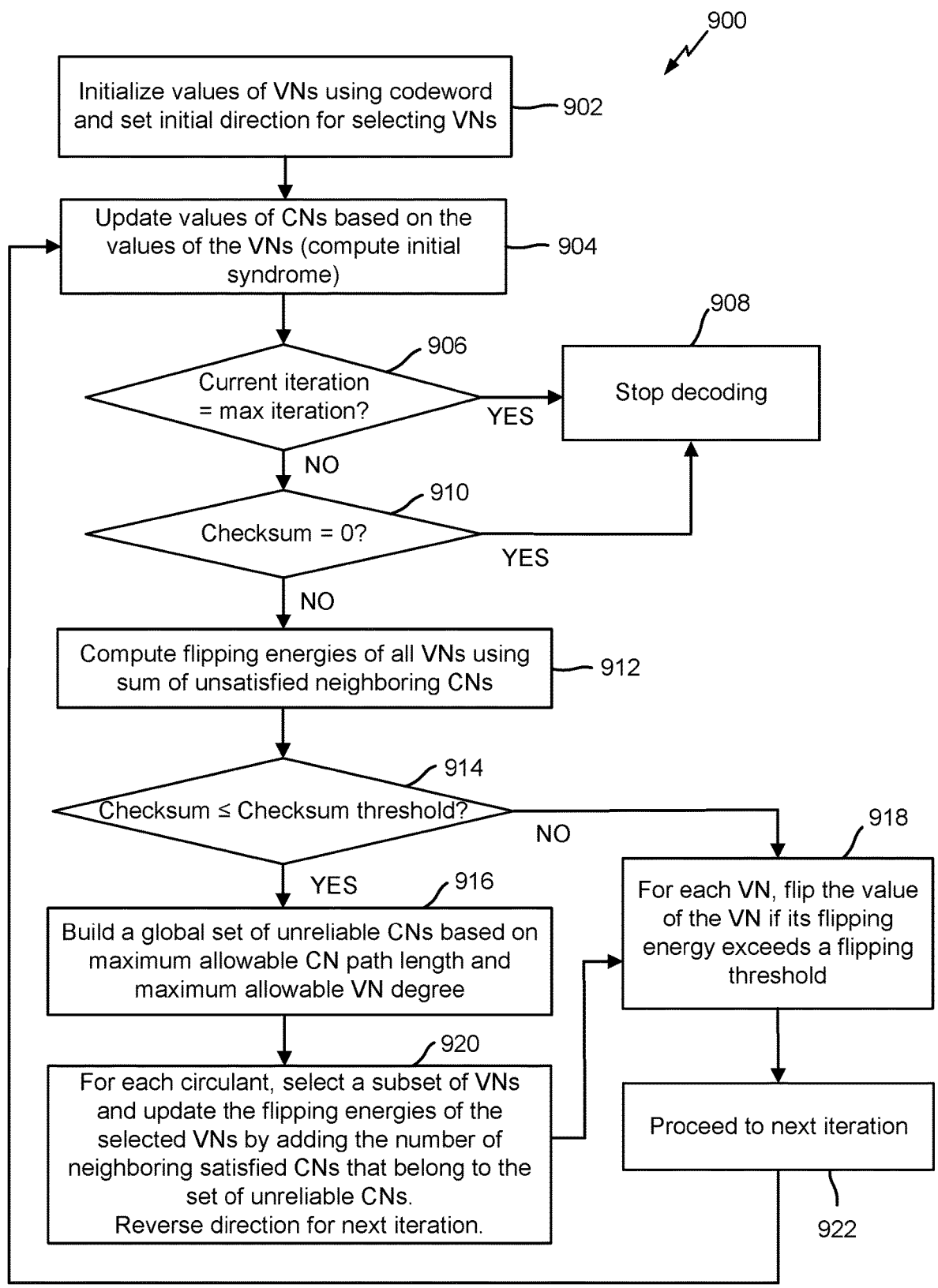
FIG. 9 is a flow diagram of an example process for decoding a codeword, in accordance with certain embodiments of the present disclosure.

FIG. 9 is a flow diagram of an example process 900 for decoding a codeword, in accordance with certain embodiments of the present disclosure. The process 900 can be performed by a BF decoder that receives ECCs (e.g., quasi-cyclic LDPC codes) for decoding. At operation 902, the bit-values of variable nodes in a parity-check matrix are initialized using a received codeword. For instance, the bit-values of the variable nodes can be set to the values of corresponding bits in the codeword, which includes data bits as well as parity bits.

Additionally, operation 902 includes setting an initial direction for selecting variable nodes. As described below in connection with operation 920, a subset of variable nodes can be selected from each circulant submatrix, and the flipping energies of the variable nodes in each selected subset can be updated using information about unreliable check nodes. In other words, in any given iteration, not every variable node of a circulant submatrix may have its flipping energy computed using information about unreliable check nodes. Each variable node of a circulant submatrix may be assigned a corresponding index value (e.g., a column number). Depending on the direction set, the variable nodes can be selected in increasing index value or decreasing index value. In this manner, the subset of variable nodes can be selected starting from one end of the circulant submatrix or an opposite end.

At operation 904, the bit-values of the check nodes are updated based on the bit-values of the variable nodes as initialized during operation 902. Since this is the first iteration, the check nodes may not have existing bit-values, and the updating in operation 904 may involve computing a bit-value for each check node using a corresponding parity-check equation. In this manner, an initial syndrome can be computed.

At operation 906, the BF decoder checks whether the current iteration equals a maximum allowable number of iterations. The maximum allowable number of iterations may be reconfigurable or fixed. If the maximum allowable number of iterations has been reached, then the process 900 proceeds to operation 908. Otherwise, the process proceeds to operation 910.

At operation 908, the BF decoder stops decoding and outputs a result, which could include a set of decoded bits or, in some instances, an error message (e.g., one or more flag bits representing an error code). For example, an error message can be output when operation 908 is performed as a result of reaching or exceeding the maximum allowable number of iterations before achieving a checksum of zero.

At operation 910, the BF decoder determines whether the checksum for the current syndrome (e.g., the initial syndrome from operation 904) is equal to zero. The checksum is zero when the bit-value of every check node is also zero. If the checksum is zero, this indicates that the codeword has been successfully decoded and the process 900 can proceed to operation 908 (stop decoding). Otherwise, the process proceeds to operation 912.

At operation 912, the flipping energies of all variable nodes in the parity-check matrix are computed using a sum of unsatisfied neighboring check nodes. In some examples, for each variable node, the flipping energy of the variable node is computed as being the total number of unsatisfied check nodes that are directly connected (i.e., by a single edge) to the variable node.

At operation 914, the BF decoder determines whether the checksum is less than or equal to a checksum threshold $CS_{th}$. The checksum threshold can be set to a relatively low value (e.g., $CS_{th}$=2) in order to target the error floor region. The error floor region usually involves a small number of unsatisfied check nodes, so a low checksum value can be used as a prerequisite condition for updating the flipping energies based on unreliable check nodes. If the checksum is less than or equal to the checksum threshold, the process 900 proceeds to operation 916. Otherwise, the process proceeds to operation 918.

At operation 916, the BF decoder builds a global set of unreliable check nodes based on a maximum allowable check node path length and a maximum allowable variable node degree. As indicated in the discussion of FIG. 7 above, maximum allowable check node path length refers to the longest allowed path between an unsatisfied check node and a candidate check node, and maximum allowable variable node degree refers to the highest degree allowed for any variable node connecting an unsatisfied check node to a candidate check node. Both of these maximum allowable values can be applied as criteria for forming the set of unreliable check nodes. The process then proceeds to operation 920.

At operation 918, the BF decoder flips the value of any variable node whose flipping energy exceeds a flipping threshold. If arriving at operation 918 from operation 914, this indicates that the BF decoder is operating outside of the error floor region. However, the BF decoder may still continue decoding until some stopping condition (e.g., one of the conditions that leads to operation 908) occurs.

At operation 920, the BF decoder selects a subset of variable nodes in each circulant and updates the flipping energies of those selected variable nodes. The updating of the flipping energies is performed by adding the number of neighboring satisfied check nodes that belong to the set of unreliable check nodes. Thus, for each variable node that belongs to a selected subset, the BF decoder may determine the total number of satisfied check nodes that are directly connected to the variable node and belong to the set of unreliable check nodes. The flipping energy calculated for the variable node in operation 912 can then be updated through summation with this total.

The subset of variable nodes is selected according to the selection direction discussed above in connection with operation 902. Depending on the selection direction, the variable nodes can be selected starting from one side (e.g., the leftmost side) of the circulant submatrix or an opposite side (e.g., the rightmost side). Typically, the subset of variable nodes includes consecutive variable nodes (e.g., the first five variable nodes or the last five variable nodes). However, some implementations may involve skipping one or more variable nodes so that the subset of variable nodes is nonconsecutive. For example, the subset of variable nodes could be formed by selecting every other variable node beginning with the leftmost (e.g., lowest indexed) variable node.

Restricting the updating of the flipping energies to only a subset of variable nodes in each circulant saves processing time. The benefits of using information about unreliable check nodes can be achieved in large part without having to update the flipping energies of every variable node. That is because, as discussed above, a trapping set can be broken down if the correct bit-values for even a few variable nodes in the trapping set are able to be determined.

Additionally, at operation 920, the selection direction is reversed for the next iteration. In some implementations, reversing the selection direction is performed by toggling a 1-bit flag. Alternating directions between iterations helps to avoid reselecting the same variable nodes, thereby introducing diversity into the variable nodes selected for flipping energy modification based on unreliable check nodes. Once the flipping energies for the selected subsets of variable nodes have been updated and the selection direction has been reversed, the process 900 proceeds to the flipping decision in operation 918, discussed above.

After making a flipping decision for each variable node in operation 918, the BF decoder proceeds to the next iteration (at operation 922), and the process 900 returns to operation 904. Accordingly, operation 922 may involve incrementing the value of a counter representing the current iteration number. Operations 904 to 922 may be repeated until a stopping condition is reached, leading to the end of decoding in operation 908.

Figure 10:
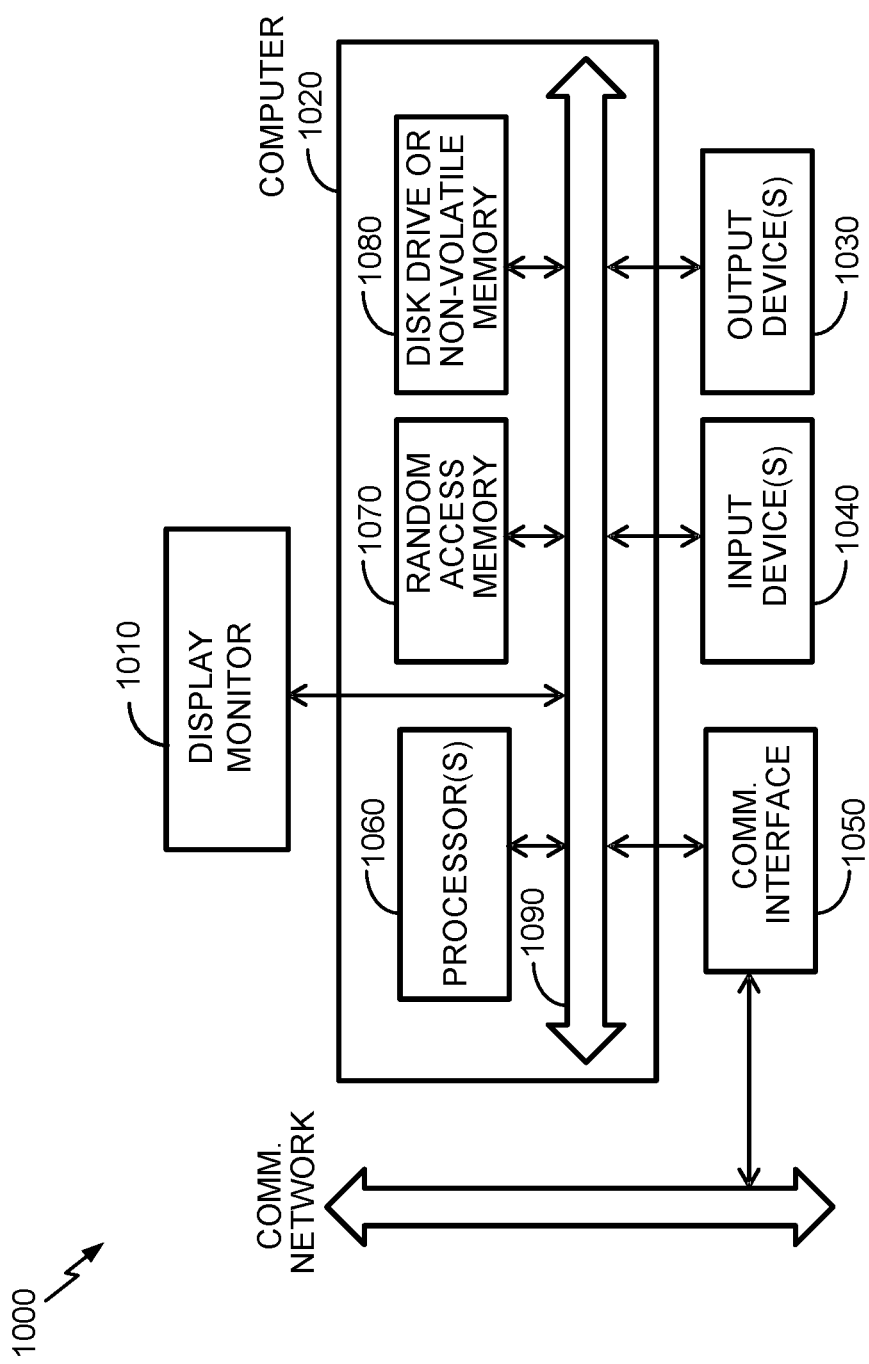
FIG. 10 illustrates a computer system usable for implementing one or more embodiments of the present disclosure.

FIG. 10 illustrates a computer system 1000 usable for implementing one or more embodiments of the present disclosure. FIG. 10 is merely an example and does not limit the scope of the disclosure as recited in the claims. As shown in FIG. 10, the computer system 1000 may include a display monitor 1010, a computer 1020, user output devices 1030, user input devices 1040, a communications interface 1050, and/or other computer hardware or accessories. The computer system 1000 or select components of the computer system 1000 can be used to implement the error correction system 200 of FIG. 2 and/or the error correction system 600 of FIG. 6.

As shown in FIG. 10, the computer 1020 may include one or more processors 1060 that communicate with a number of peripheral devices via a bus subsystem 1090. These peripheral devices may include the user output devices 1030, the user input devices 1040, the communications interface 1050, and a storage subsystem, such as a random access memory (RAM) 1070 and a disk drive or non-volatile memory 1080.

The user input devices 1040 include all possible types of devices and mechanisms for inputting information to the computer 1020. These may include a keyboard, a keypad, a touch screen incorporated into the display, audio input devices such as voice recognition systems, microphones, and other types of input devices. In various embodiments, the user input devices 1040 are typically embodied as a computer mouse, a trackball, a track pad, a joystick, a wireless remote, a drawing tablet, a voice command system, an eye tracking system, and the like. The user input devices 1040 typically allow a user to select objects, icons, text and the like that appear on the monitor 1010 via a command such as a click of a button or the like.

The user output devices 1030 include all possible types of devices and mechanisms for outputting information from the computer 1020. These may include a display (e.g., the monitor 1010), non-visual displays such as audio output devices, etc.

The communications interface 1050 provides an interface to other communication networks and devices. The communications interface 1050 may serve as an interface for receiving data from and transmitting data to other systems. Embodiments of the communications interface 1050 typically include an Ethernet card, a modem (telephone, satellite, cable, ISDN), (asynchronous) digital subscriber line (DSL) unit, FireWire interface, USB interface, and the like. For example, the communications interface 1050 may be coupled to a computer network, to a FireWire bus, or the like. In other embodiments, the communications interfaces 1050 may be physically integrated on the motherboard of the computer 1020, and may be a software program, such as soft DSL, or the like.

In various embodiments, the computer system 1000 may also include software that enables communications over a network such as the HTTP, TCP/IP, RTP/RTSP protocols, and the like. In alternative embodiments of the present disclosure, other communications software and transfer protocols may also be used, for example IPX, UDP or the like.

The RAM 1070 and the disk drive 1080 are examples of tangible media configured to store data such as embodiments of the present disclosure, including executable computer code, human readable code, or the like. Other types of tangible media include floppy disks, removable hard disks, optical storage media such as CD-ROMS, DVDs and bar codes, semiconductor memories such as flash memories, non-transitory read-only-memories (ROMS), battery-backed volatile memories, networked storage devices, and the like. The RAM 1070 and the disk drive 1080 may be configured to store the basic programming and data constructs that provide the functionality of the present disclosure.

Software code modules and instructions that provide the functionality of the present disclosure may be stored in the RAM 1070 and the disk drive 1080. These software modules may be executed by the processor(s) 1060. The RAM 1070 and the disk drive 1080 may also provide a repository for storing data used in accordance with the present disclosure.

The RAM 1070 and the disk drive 1080 may include a number of memories including a main random access memory (RAM) for storage of instructions and data during program execution and a read-only memory (ROM) in which fixed non-transitory instructions are stored. The RAM 1070 and the disk drive 1080 may include a file storage subsystem providing persistent (non-volatile) storage for program and data files. The RAM 1070 and the disk drive 1080 may also include removable storage systems, such as removable flash memory.

The bus subsystem 1090 provides a mechanism for letting the various components and subsystems of the computer 1020 communicate with each other as intended. Although the bus subsystem 1090 is shown schematically as a single bus, alternative embodiments of the bus subsystem may utilize multiple busses.

It will be readily apparent to one of ordinary skill in the art that many other hardware and software configurations are suitable for use with the present disclosure. For example, the computer 1020 may be a desktop, portable, rack-mounted, or tablet configuration. Additionally, the computer 1020 may be a series of networked computers. In still other embodiments, the techniques described above may be implemented upon a chip or an auxiliary processing board.

Various embodiments of the present disclosure can be implemented in the form of logic in software or hardware or a combination of both. The logic may be stored in a computer readable or machine-readable non-transitory storage medium as a set of instructions adapted to direct a processor of a computer system to perform a set of steps disclosed in embodiments of the present disclosure. The logic may form part of a computer program product adapted to direct an information-processing device to perform a set of steps disclosed in embodiments of the present disclosure. Based on the disclosure and teachings provided herein, a person of ordinary skill in the art will appreciate other ways and/or methods to implement the present disclosure.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

Although the foregoing embodiments have been described in some detail for purposes of clarity of understanding, the disclosure is not limited to the details provided. There are many alternative ways of implementing the disclosure. The disclosed embodiments are illustrative and not restrictive.

What is claimed is:

1. A method for iterative decoding of a low-density parity-check (LDPC) codeword, the method implemented on a computing device and comprising:
   identifying, during a first iteration, unsatisfied check nodes (CNs) among a set of CNs, wherein the set of CNs represents a result of applying parity-check equations to the LDPC codeword;
   determining a set of unreliable CNs such that a path length between each CN in the set of unreliable CNs and an unsatisfied CN is less than or equal to a maximum allowable path length;
   computing a flipping energy for each variable node (VN) in a set of VNs based on a total number of unsatisfied CNs directly connected to the VN, and further based on a total number of satisfied CNs that are directly connected to the VN and belong to the set of unreliable CNs;
   updating bit-values of the set of VNs, wherein the updating comprises determining, for each VN in the set of VNs, whether to flip a bit-value of the VN based on a flipping energy of the VN; and
   updating, based on the updated bit-values of the set of VNs, bit-values of the set of CNs for use during a next iteration.

2. The method of claim 1, wherein the determining of the set of unreliable CNs is conditioned upon a checksum computed using the bit-values of the set of CNs being less than or equal to a threshold value.

3. The method of claim 2, wherein the threshold value is set to a value associated with checksums expected in an error floor region.

4. The method of claim 1, wherein the determining of the set of unreliable CNs comprises excluding CNs that are connected to an unsatisfied CN through a high degree VN, and wherein a high degree VN is any VN that is directly connected to more than a threshold number of CNs.

5. The method of claim 4, wherein the threshold number of CNs is less than or equal to five.

6. The method of claim 1, wherein the LDPC codeword is a quasi-cyclic LDPC codeword.

7. The method of claim 1, wherein the set of VNs corresponds to a parity-check matrix that is divided into circulant submatrices, the method further comprising:
   restricting use of the set of unreliable CNs in computing flipping energy to a subset of VNs in each circulant submatrix.

8. The method of claim 7, further comprising:
   during the first iteration, selecting the subset of VNs starting from a first direction; and
   during the next iteration, selecting the subset of VNs starting from a second direction that is opposite the first direction.

9. The method of claim 7, wherein the subset of VNs comprises consecutive VNs.

10. The method of claim 7, wherein the subset of VNs comprises nonconsecutive VNs.

11. A device comprising:
    a memory storing a low-density parity-check (LDPC) codeword; and
    one or more processing units configured to:
    identify, during a first iteration, unsatisfied check nodes (CNs) among a set of CNs, wherein the set of CNs represents a result of applying parity-check equations to the LDPC codeword;
    determine a set of unreliable CNs such that a path length between each CN in the set of unreliable CNs and an unsatisfied CN is less than or equal to a maximum allowable path length;
    compute a flipping energy for each variable node (VN) in a set of VNs based on a total number of unsatisfied CNs directly connected to the VN, and further based on a total number of satisfied CNs that are directly connected to the VN and belong to the set of unreliable CNs;
    update bit-values of the set of VNs through determining, for each VN in the set of VNs, whether to flip a bit-value of the VN based on a flipping energy of the VN; and
    update, based on the updated bit-values of the set of VNs, bit-values of the set of CNs for use during a next iteration.

12. The device of claim 11, wherein the device is configured to determine the set of unreliable CNs only in response to determining that a checksum computed using the bit-values of the set of CNs is less than or equal to a threshold value.

13. The device of claim 12, wherein the threshold value is set to a value associated with checksums expected in an error floor region.

14. The device of claim 11, wherein the device is configured to exclude from the set of unreliable CNs any CNs that are connected to an unsatisfied CN through a high degree VN, and wherein a high degree VN is any VN that is directly connected to more than a threshold number of CNs.

15. The device of claim 14, wherein the threshold number of CNs is less than or equal to five.

16. The device of claim 11, wherein the set of VNs corresponds to a parity-check matrix that is divided into circulant submatrices, and wherein the one or more processing units are further configured to restrict use of the set of unreliable CNs in computing flipping energy to a subset of VNs in each circulant submatrix.

17. The device of claim 16, wherein the one or more processing units are further configured to:
- during the first iteration, select the subset of VNs starting from a first direction; and
- during the next iteration, select the subset of VNs starting from a second direction that is opposite the first direction.

18. An error correction system comprising:
- a first low-density parity-check (LDPC) decoder; and
- a second LDPC decoder configured to decode an LDPC codeword in less time than the first LDPC decoder, wherein the second LDPC decoder is a bit flipping decoder configured to:
  - identify, during a first iteration, unsatisfied check nodes (CNs) among a set of CNs, wherein the set of CNs represents a result of applying parity-check equations to the LDPC codeword;
  - determine a set of unreliable CNs such that a path length between each CN in the set of unreliable CNs and an unsatisfied CN is less than or equal to a maximum allowable path length;
  - compute a flipping energy for each variable node (VN) in a set of VNs based on a total number of unsatisfied CNs directly connected to the VN, and further based on a total number of satisfied CNs that are directly connected to the VN and belong to the set of unreliable CNs;
  - update bit-values of the set of VNs through determining, for each VN in the set of VNs, whether to flip a bit-value of the VN based on a flipping energy of the VN; and
  - update, based on the updated bit-values of the set of VNs, bit-values of the set of CNs for use during a next iteration.

19. The error correction system of claim 18, wherein the bit flipping decoder is configured to determine the set of unreliable CNs only in response to determining that a checksum computed using the bit-values of the set of CNs is less than or equal to a threshold value.

20. The error correction system of claim 18, wherein the bit flipping decoder is configured to exclude from the set of unreliable CNs any CNs that are connected to an unsatisfied CN through a high degree VN, and wherein a high degree VN is any VN that is directly connected to more than a threshold number of CNs.

* * * * *